(12) United States Patent
Schwartz

(10) Patent No.: US 10,444,409 B2
(45) Date of Patent: Oct. 15, 2019

(54) MWIR/LWIR TRANSPARENT, CONDUCTIVE COATINGS

(71) Applicant: Goodrich Corporation, Charlotte, NC (US)

(72) Inventor: Bradley Dean Schwartz, Brewster, NY (US)

(73) Assignee: Goodrich Corporation, Charlotte, NC (US)

( * ) Notice: Subject to any disclaimer, the term of this patent is extended or adjusted under 35 U.S.C. 154(b) by 0 days.

(21) Appl. No.: 15/680,425

(22) Filed: Aug. 18, 2017

(65) Prior Publication Data

US 2019/0056532 A1   Feb. 21, 2019

(51) Int. Cl.
| | | |
|---|---|---|
| G02B 5/20 | (2006.01) | |
| G02B 1/16 | (2015.01) | |
| G02B 13/14 | (2006.01) | |
| G02B 1/11 | (2015.01) | |
| C04B 35/115 | (2006.01) | |
| G01J 5/08 | (2006.01) | |
| C23C 16/30 | (2006.01) | |
| C30B 29/40 | (2006.01) | |
| C23C 18/12 | (2006.01) | |
| G02B 1/113 | (2015.01) | |

(Continued)

(52) U.S. Cl.
CPC .............. *G02B 1/16* (2015.01); *C04B 35/115* (2013.01); *C23C 16/301* (2013.01); *C23C 18/1258* (2013.01); *C30B 29/40* (2013.01); *G01J 5/0875* (2013.01); *G02B 1/11* (2013.01); *G02B 1/113* (2013.01); *G02B 5/207* (2013.01); *G02B 5/208* (2013.01); *G02B 13/14* (2013.01); *H01L 31/0203* (2013.01); *G01J 2005/065* (2013.01)

(58) Field of Classification Search
CPC ....... H01L 31/022466; H01L 27/14601; H01L 27/1462; H01L 31/02162; H01L 31/1884; H01L 33/42; Y02E 10/50; G02B 1/16
See application file for complete search history.

(56) References Cited

U.S. PATENT DOCUMENTS

| | | |
|---|---|---|
| 2,977,477 A | 3/1961 | Rosi et al. |
| 5,012,112 A | 4/1991 | Flint et al. |

(Continued)

OTHER PUBLICATIONS

S. P. Watkins, C. A. Tran, G. Soerensen, H. D. Cheung, R. A. Area, Y. Lacroix, M. L. W. Thewalt, J. Electronic Materials 24, 1583 (1995) "Characterization of Very High Purity InAs Grown Using Trimethylindium and Tertiarybutylarsine" http://www.sfu.ca/phys/431/references/semiconductors/watkins%20InAs%20JEM%201995.pdf—accessed Aug. 18, 2017.

(Continued)

*Primary Examiner* — William R Alexander
*Assistant Examiner* — Balram T Parbadia
(74) *Attorney, Agent, or Firm* — Locke Lord LLP; Scott D. Wofsy; Joshua L. Jones

(57) ABSTRACT

An optical system includes a housing, an imaging device housed within the housing, and a window in the housing providing an optical path through the housing to the imaging device. The window includes a transparent substrate and a coating over the transparent substrate. The coating is made of an electrically conductive semiconductor. The imaging device is sensitive to and the coating is transparent to at least one of MWIR and/or LWIR wavelengths.

14 Claims, 2 Drawing Sheets

(51) Int. Cl.
*H01L 31/0203* (2014.01)
*G01J 5/06* (2006.01)

(56) References Cited

U.S. PATENT DOCUMENTS

| | | | |
|---|---|---|---|
| 5,724,180 A * | 3/1998 | Wellman | G02F 1/13439 257/E31.126 |
| 6,181,468 B1 | 1/2001 | Feng et al. | |
| 9,276,034 B2 | 3/2016 | Zmek et al. | |
| 2005/0014033 A1 * | 1/2005 | Cheung | H01L 31/02246 428/701 |
| 2005/0017175 A1 | 1/2005 | Lee et al. | |
| 2008/0061222 A1 * | 3/2008 | Powers | B82Y 15/00 250/226 |
| 2009/0059406 A1 * | 3/2009 | Powers | B82Y 20/00 359/889 |
| 2014/0043519 A1 * | 2/2014 | Azuma | G03B 3/10 348/345 |
| 2015/0289424 A1 * | 10/2015 | Zmek | H01L 27/14685 250/208.1 |
| 2016/0068686 A1 * | 3/2016 | Wahl | C09D 5/08 106/14.05 |

OTHER PUBLICATIONS

H. Okimura, C. R. Kannewurf, J. O. Brittain, J. Electronic Mat. 7, 627-637 Preparation and electrical properties of InAs thin films http://rd.springer.com/article/10.1007/BF02655438—accessed Aug. 18, 2017.

H. E. Kunig, J. Vac. Sci. Tech 7, 100 (1970)"Formation of Thin InAs Films for Electronic Devices" http://avs.scitation.org/doi/abs/10.1116/1.1315761?journalCode=jvs—accessed Aug. 18, 2017.

H. Ye, L. Li, J. Vac. Sci. Tech. B, 31, 03C135 (2013) "MBE growth optimization of InAs (001) homoepitaxy" http://avs.scitation.org/doi/abs/10.1116/1.4804397?journalCode=jvb—accessed Aug. 18, 2017.

A. K. Al-Mousoi, M. K. A. Mohammed, and H. Khalaf, Optik— International Journal for Light and Electron Optics 127 (15)—Apr. 2016 "Preparing and Characterization of Indium Arsenide (InAs) Thin Films by Chemical Spray Pyrolysis (CSP) Technique" https://www.infona.pl/resource/bwmeta1.element.elsevier-0803115a-1328-3b1c-88b2-97dcfc14a4b8—accessed Aug. 18, 2017.

Y. Ikawa, A. Yoshikawa, Y. Sakai, Electrical Engineering in Japan 95, 6 (1975) "Preparation of InAs films for hall elements: Chemical vapor deposition method using H2O as transport agent" http://onlinelibrary.wiley.com/doi/10.1002/eej.4390950601/abstract—accessed Aug. 18, 2017.

P. Marchand, S. Sathasivam, B. A. D. Williamson, D. Pugh, S. M. Bawaked, S. N. Basahel, A. Y. Obaid, D. O. Scanlon, I. P. Parkin, C. J. Carmalt J. Mater. Chem. C. Mater. Opt. Electron Devices, Jul. 28, 2016; 4(28): 6761-6768. "A single-source precursor approach to solution processed indium arsenide thin films" https://www.ncbi.nlm.nih.gov/pmc/articles/PMC5059786/—accessed Aug. 18, 2017.

R. Bhata, P.S. Dutta, S. Guhab, Journal of Crystal Growth 310 (2008) 1910-1916 "Crystal growth and below-bandgap optical absorption studies in InAs for non-linear optic applications" http://homepages.rpi.edu/~duttap/Publications/2008JCG310-1910.pdf—accessed Aug. 18, 2017.

Dixon, J. R., Proc. 5th Int. Conf. on Physics of Semiconductors, Prague, 1961, p. 366 http://www.ioffe.ru/SVA/NSM/Semicond/InAs/optic.html—accessed Aug. 18, 2017.

J. R. Dixon and J. M. Ellis, Phys. Rev. 123, 5 (1961) 1560-1567 "Optical Properties of n-Type Indium Arsenide in the Fundamental Absorption Edge Region" http://www.ioffe.ru/SVA/NSM/Semicond/InAs/optic.html—accessed Aug. 18, 2017.

Partial European Search Report dated Feb. 6, 2019, issued during the prosecution of European Patent Application No. EP 18189357.9.

Stuckes, A. D., et al., Electrical and Thermal Properties of Alloys of InAs and CdTe, Pergamon Press 1964, vol. 25, pp. 469-476, 8 pages.

Yakes, M. K., et al., "Evaluation of strained InAlAs as a window layer for wide bandgap materials lattice matched to InP", 2015 IEEE 42nd Photovoltaic Specialist Conference Jun. 14, 2015, pp. 1-4.

Extended European Search Report dated Jul. 1, 2019, issued during the prosecution of European Patent Application No. EP 18189357.9.

Qiyuan Xu, et al., :Antireflective Characteristics of GeCfilms on Sub-Wavelength Structured ZnS Surfaces, Optical Materials, Elsevier Science Publishers B.V. Amsterdam, NL,, vol. 34, No. 1, Aug. 16, 2011, pp. 244-247.

Denatale, J. F., et al., "Fabrication and Characterization of Diamond Moth Eye Antireflective Surfaces on Ge", Journal of Applied Phy, American Institute of Physics, US., vol. 71, No. 3, Feb. 1, 1982, pp. 1388-1393.

\* cited by examiner

MWIR/LWIR TRANSPARENT, CONDUCTIVE COATINGS

BACKGROUND OF THE INVENTION

1. Field of the Invention

The present disclosure relates to optical coatings, and more particularly to electrically conductive optical coatings.

2. Description of Related Art

Electro-optic (EO) systems require windows to protect the sensor and electronics from outside elements. In addition to rain, dust, and the like, in many cases the window must also block electromagnetic interference (EMI) that would otherwise impede the EO system performance.

EMI shielding can be accomplished with a window that is electrically conductive and optically transparent. There are three conventional types of shielding.

The first type of EMI shielded window uses a semiconductor material such as silicon or germanium that is doped with a group V element such as phosphorous, arsenic, or antimony to supply additional electrons to provide electrical conductivity. These windows are opaque for visible wavelengths and are thus not useful for broadband EO systems.

The second type of shielded window uses a continuous, transparent, conductive coating. These coatings consist of wide bandgap semiconductors such as indium oxide ($In_2O_3$) and zinc oxide (ZnO) that have broadband optical transparency. The semiconductors are doped to provide electrical conductivity. However, as doping increases to increase electrical conductivity and EMI attenuation, optical transmittance decreases. This effect begins at longer wavelengths where both plasma reflectance and free-carrier absorption from electrons decrease transmittance. Traditional transparent, conductive semiconductor coatings are practical only in the 0.4 to 2.0 micron range, short wavelength visible through short wavelength infrared (SWIR).

The third type of shielded window is traditionally required for broadband applications from the visible to the long-wave infrared (LWIR). A grid of fine metal lines is applied on the surface of the window. Typical dimensions are 5-micron wide lines with 140 micron spacing. These gridded windows enable optical transmittance over a broad wavelength range, but they limit optical transmittance by obscuration and scattering.

U.S. Pat. No. 9,276,034 presents a method for reducing the optical scattering from a conductive grid. Channels are etched into a window substrate, and an electrically conductive semiconductor is deposited in the channels such that the surface of the window is planar. The semiconductor is transparent for visible and short wavelength infrared (SWIR) wavelengths but reflecting and absorbing for mid wavelength infrared (MWIR) and longer wavelengths. Using a semiconductor with an index of refraction close to that of the substrate minimizes light scattering from the grid lines. Alternatively, the doped, electrically conductive semiconductor grid can be embedded in an undoped semiconductor coating with a close index of refraction and broadband optical transparency.

The conventional techniques have been considered satisfactory for their intended purpose. However, there is an ever present need for improved electrically conductive optical coatings, e.g., for MWIR and LWIR optics. This disclosure provides a solution for this problem.

SUMMARY OF THE INVENTION

A window includes a transparent substrate and a coating over the transparent substrate. The coating is made of an electrically conductive semiconductor that is transparent to at least one of MWIR and/or LWIR wavelengths.

The coating can have its peak transmission in MWIR wavelengths. The transparent substrate can include sapphire, aluminum oxynitride (AlON), and/or Spinel.

The coating can be transparent in LWIR wavelengths. The transparent substrate can include at least one of ZnS and/or ZnSe.

The coating can include InAs, InGaAs, and/or InAlAs. The coatings can be doped with Te, S, Se, Si, or Sn to provide additional electrons for increased electrical conductivity. The coating can be embedded in a pattern in the transparent substrate or in a base coating on the substrate. The pattern can include a grid. The coating and substrate or base coating can have closely matched indices of refraction to mitigate light scattering through the pattern. The coating can have a sheet resistance of less than 200 ohms per square. An anti-reflection coating can be included over the coating.

An optical system includes a housing, an imaging device housed within the housing, and a window in the housing providing an optical path through the housing to the imaging device. The window includes a transparent substrate and a coating over the transparent substrate. The coating is made of an electrically conductive semiconductor. The imaging device is sensitive to and the coating is transparent to at least one of MWIR and/or LWIR wavelengths.

A method of making a window for an optical system includes forming a coating on a transparent substrate. The coating can be formed as a film on the transparent substrate by at least one of metalorganic chemical vapor deposition (MOCVD), evaporation, molecular beam epitaxy (MBE), chemical spray pyrolysis, chemical vapor deposition (CVD), and/or aerosol-assisted CVD.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
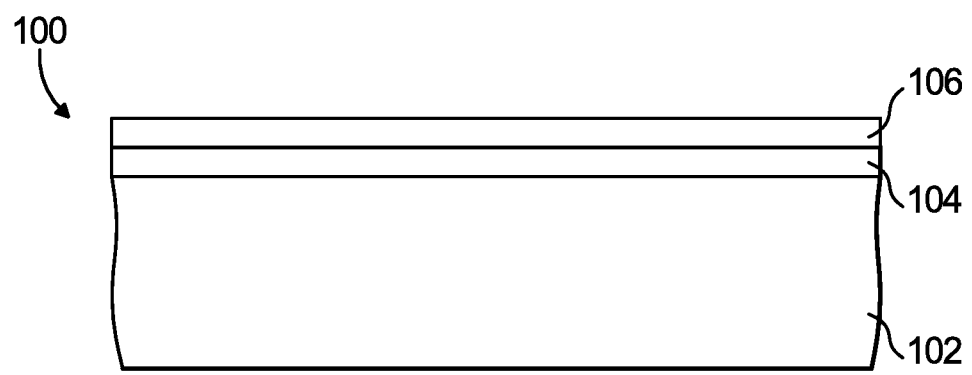
FIG. 1 is a schematic side-elevation view of an exemplary embodiment of a window constructed in accordance with the present disclosure, showing the transparent substrate, the electrically conductive semiconductor coating, and an anti-reflection coating.

Reference will now be made to the drawings wherein like reference numerals identify similar structural features or aspects of the subject disclosure. For purposes of explanation and illustration, and not limitation, a partial view of an exemplary embodiment of a window for an imaging system in accordance with the disclosure is shown in FIG. 1 and is designated generally by reference character 100. Other embodiments of windows in accordance with the disclosure, or aspects thereof, are provided in FIGS. 2-4, as will be described. The systems and methods described herein can be used to provide windows with electromagnetic interference (EMI) shielding for imaging systems.

Window 100 includes a transparent substrate 102 and a coating 104 over the transparent substrate 102. The coating 104 is made of an electrically conductive semiconductor, that is transparent to at least one of mid-wavelength infrared (MWIR) and/or long-wavelength infrared (LWIR) wavelengths. For example, in embodiments, the coating 104 has its peak transmission in MWIR wavelengths, and the transparent substrate 102 includes sapphire, aluminum oxynitride (AlON), and/or Spinel. The coatings can be doped with Te, S, Se, Si, or Sn to provide additional electrons for increased electrical conductivity. A suitable coating 104 for this peak transmission is InAs, a Te-doped InAs film (InAs:Te), which has low absorption in the 3 to 12 micron range with a peak transmission exceeding 80% from 4.6 to 5.1 microns without an anti-reflection (AR) coating. An optional anti-reflection coating 106 over the coating 104 increases transmittance through window 100. Other suitable coating materials for this application include InGaAs and/or InAlAs. These materials allow the coating 104 to have a sheet resistance of less than 200 ohms per square, with enough electron mobility to provide EMI shielding for imaging devices.

It is also contemplated that the coating 104 can be is transparent in LWIR wavelengths, e.g., with its peak transmission in LWIR wavelengths. The transparent substrate 102 for such an application can include at least one of ZnS and/or ZnSe. Adding a group III element such as aluminum or gallium to InAs creates a compound (InGaAs, InAlAs) with a higher bandgap and extend transmission to shorter wavelengths. However, such materials are expected to have lower electron mobility than InAs and reduced long wavelength transmission. Therefore, there is a compromise between SWIR and MWIR to LWIR transmission.

The coating 104 is formed as a film on the transparent substrate 102. This can be accomplished by metalorganic chemical vapor deposition (MOCVD), evaporation, molecular beam epitaxy (MBE), chemical spray pyrolysis, chemical vapor deposition (CVD), aerosol-assisted CVD, and/or any other suitable process.

Figure 2:
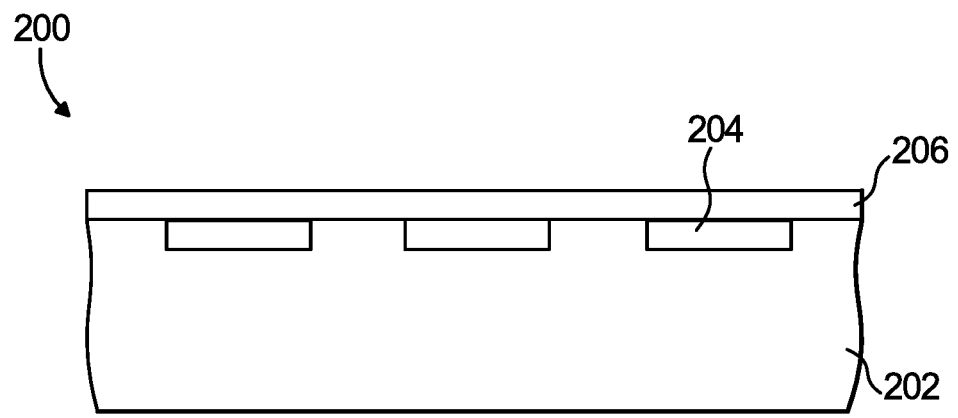
FIG. 2 is a schematic side-elevation view of another exemplary embodiment of a window constructed in accordance with the present disclosure, showing the electrically conductive semiconductor coating embedded in a pattern in the transparent substrate.
Figure 3:
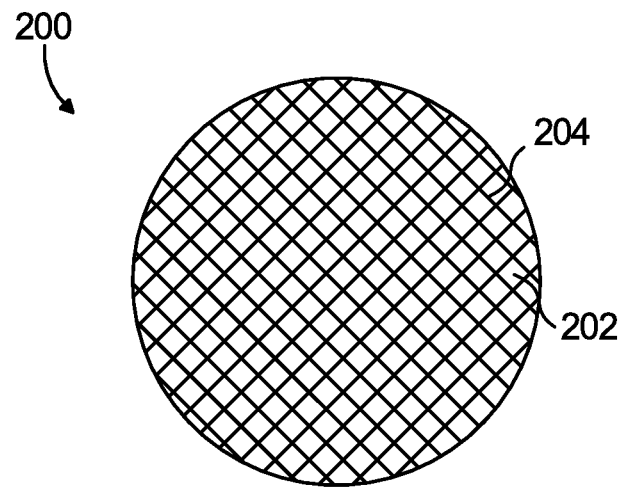
FIG. 3 is a schematic plan view of the window of FIG. 2, showing the two-dimensional pattern.

Referring now to FIG. 2, another exemplary embodiment of a window 200 is shown with a transparent substrate 202. The coating 204 is embedded in a pattern in the transparent substrate 202. An anti-reflection coating 206 can optionally be included over the patterned surface of the substrate 202 and coating 206. As shown in FIG. 3, the pattern can include a grid, or any other suitable pattern. The coating 204 and substrate 202 or base coating on the substrate can have closely matched indices of refraction to mitigate light scattering through the pattern. The pattern can extend transparency of the window 200 beyond the MWIR and LWIR wavelengths, e.g., into the visible wavelengths while still providing electrical conductivity for at least some EMI shielding.

The pattern can be selected for a given application with a tradeoff between EMI shielding and transparency to wider bands balanced for the application. For example, visible and SWIR wavelengths can transmit where there is no grid (between the grid lattices where substrate 202 is not covered with the grid of coating 204), and the grid itself can be transparent to MWIR and LWIR wavelengths. Furthermore, if the grid lines are embedded in a base coating or in substrate 202 itself with a close index of refraction (n=3.5 at 5 microns), diffraction from the grid is greatly reduced. There is a compromise between transmittance and sheet resistance as less surface area is covered by a grid than a continuous coating.

Figure 4:
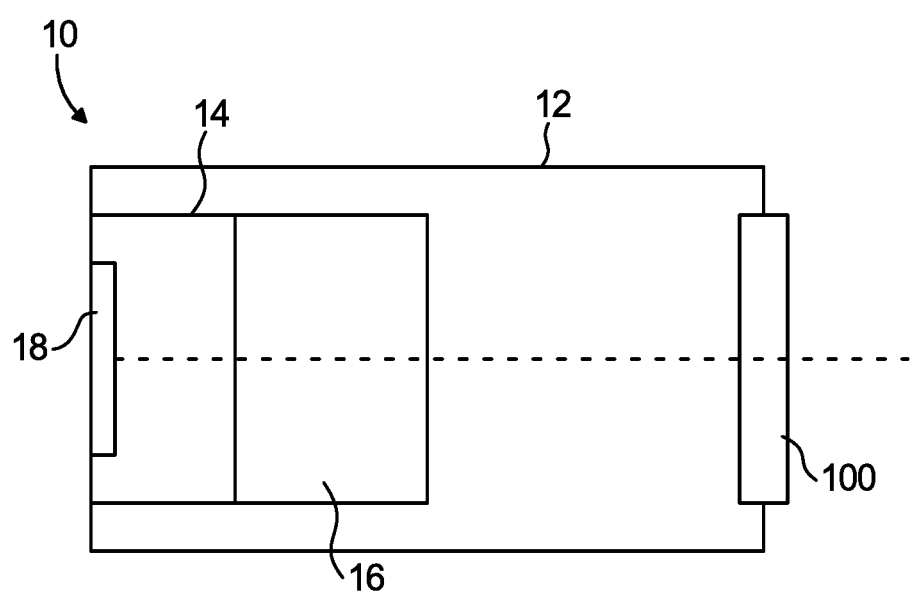
FIG. 4 is a schematic view of an imaging system incorporating a window as shown in FIG. 1.

With reference now to FIG. 4, the optical system 10 includes a housing 12, an imaging device 14 housed within the housing, and a window 100 as described above in the housing 12 providing an optical path through the housing 12 to the imaging device 14 as indicated in FIG. 4 by the dashed line. The imaging device 14 includes optics 16 that are optically coupled with an imaging sensor 18 for forming images. The window 100 and housing provide EMI shielding to the components therein, including imaging device 14. The sensor 18 of the imaging device 14 is sensitive to and the coating is transparent to at least one of MWIR and/or LWIR wavelengths. If the sensor 18 is sensitive in only MWIR wavelengths (i.e. has its peak sensitivity in MWIR wavelengths), the window 100 need only be transparent in the MWIR wavelengths, e.g., using configurations as described above. If the sensor 18 is sensitive only to LWIR wavelengths, the window 100 need only be transparent in the LWIR wavelengths, e.g., using configurations as described above. If the sensor 18 is intended for imaging in the MWIR and LWIR, the window 100 can be configured as described above for transparency in both MWIR and LWIR wavelengths. While system 10 is described and shown using window 100 with a continuous film coating 104 as shown in FIG. 1, window 200 of FIGS. 2-3 can be used with the patterned coating 206 without departing from the scope of this disclosure.

The methods and systems of the present disclosure, as described above and shown in the drawings, provide for electrically conductive coatings with superior properties including MWIR and/or LWIR optical transmittance. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. An optical system comprising:
   a housing;
   an imaging device housed within the housing; and
   a window in the housing providing an optical path through the housing to the imaging device, wherein the window includes:
   a transparent substrate that is at least one of MWIR and/or LWIR transparent; and
   a coating embedded in the transparent substrate, the coating being made of an electrically conductive semiconductor, wherein the imaging device is sensitive to and wherein the coating is transparent to at least one of MWIR and/or LWIR wavelengths, wherein the coating is embedded in the transparent substrate in a grid pattern, the coating and transparent substrate having closely matched indices of refraction to mitigate light scattering through the pattern, wherein the conductive coating is embedded in a pattern in a transparent coating on the transparent substrate, the coating and a transparent base coating have closely matched indices of refraction to mitigate light scattering through the pattern, and wherein the housing and the window are an electromagnetic interference (EMI) shield for the imaging device for wavelengths larger than the spaces between the lattices in the grid.

2. The optical system as recited in claim 1, wherein the coating has its peak transmission in MWIR wavelengths.

3. The optical system as recited in claim 2, wherein the transparent substrate includes sapphire, Aluminum Oxynitride (AlON), and/or Spinel.

4. The optical system as recited in claim 1, wherein the coating is transparent in LWIR wavelengths.

5. The optical system as recited in claim 4, wherein the transparent substrate includes at least one of ZnS and/or ZnSe.

6. The optical system as recited in claim 1, wherein the coating includes InAs.

7. The optical system as recited in claim 1, wherein the coating is doped with at least one of Te, S, Se, Si, and/or Sn.

8. The optical system as recited in claim 1, wherein the coating includes InGaAs.

9. The optical system as recited in claim 1, wherein the coating includes InAlAs.

10. The optical system as recited in claim 1, wherein the coating is formed as a film on the transparent substrate by at least one of metalorganic chemical vapor deposition (MOCVD), evaporation, molecular beam epitaxy (MBE), chemical spray pyrolysis, chemical vapor deposition (CVD), and/or aerosol-assisted CVD.

11. The optical system as recited in claim 1, further comprising an anti-reflection coating over the coating.

12. The optical system as recited in claim 1, wherein the coating has a sheet resistance of less than 200 Ohms per square.

13. The system as recited in claim 1, wherein the coating has its peak transmission in MWIR wavelengths, and wherein the imaging device is sensitive to MWIR wavelengths.

14. The system as recited in claim 1, wherein the coating is transparent in LWIR wavelengths, and wherein the imaging device is sensitive to LWIR wavelengths.

* * * * *